(12) United States Patent
Bravek et al.

(10) Patent No.: US 6,707,683 B1
(45) Date of Patent: Mar. 16, 2004

(54) CIRCUIT BOARD HAVING IMPROVED SOLDERING CHARACTERISTICS

(75) Inventors: Eric S. Bravek, Brookings, SD (US); Randy S. Uehran, Brookings, SD (US)

(73) Assignee: Daktronics, Inc., Brookings, SD (US)

( * ) Notice: Subject to any disclaimer, the term of this patent is extended or adjusted under 35 U.S.C. 154(b) by 0 days.

(21) Appl. No.: 09/917,483

(22) Filed: Jul. 27, 2001

(51) Int. Cl.⁷ .............. H05K 7/02; H05K 7/12; H05K 1/11
(52) U.S. Cl. .............. 361/777; 361/767; 361/770; 174/261; 439/38; 228/175
(58) Field of Search ................. 228/260, 125, 228/135, 175, 178, 180.1, 259, 180.21, 180.22; 439/381, 65; 174/250, 260, 261; 361/397, 400, 401, 767, 777, 770; 438/106–108, 612–614; 257/780–784

(56) References Cited

U.S. PATENT DOCUMENTS

| | | | | |
|---|---|---|---|---|
| 3,610,811 A | * | 10/1971 | O'Keefe | 174/262 |
| 3,850,711 A | * | 11/1974 | Conley | 216/18 |
| 4,217,024 A | * | 8/1980 | Aldridge et al. | 439/381 |
| 4,296,993 A | * | 10/1981 | Wellington | 439/876 |
| 4,734,818 A | * | 3/1988 | Hernandez et al. | 174/52.4 |
| 4,912,603 A | * | 3/1990 | Seyama | 361/777 |
| 5,129,573 A | * | 7/1992 | Duffey | 228/135 |
| 5,446,621 A | * | 8/1995 | Jansen et al. | 174/252 |
| 5,450,290 A | * | 9/1995 | Boyko et al. | 361/792 |
| 5,736,680 A | * | 4/1998 | Caldwell et al. | 174/250 |
| 5,784,262 A | * | 7/1998 | Sherman | 361/777 |
| 5,886,878 A | * | 3/1999 | Khadem et al. | 174/138 G |
| RE36,442 E | * | 12/1999 | Kardos | 324/758 |
| 6,305,596 B1 | * | 10/2001 | Lin et al. | 228/125 |
| 2003/0054589 A1 | * | 3/2003 | Matsuda et al. | 438/108 |

* cited by examiner

Primary Examiner—L. Edmondson
(74) Attorney, Agent, or Firm—Hugh D. Jaeger

(57) ABSTRACT

A circuit board having improved soldering characteristics having raised structure consisting of spacer pads arranged to provide for vertical distancing of electrical or electronic components from the component side planar surface of the circuit board. Such spacing is complementary to top vented soldering stations where the spacing allows solder process gases to flow unimpeded from the soldering stations through the spacing to atmosphere.

2 Claims, 5 Drawing Sheets

US 6,707,683 B1

CIRCUIT BOARD HAVING IMPROVED SOLDERING CHARACTERISTICS

CROSS REFERENCES TO RELATED APPLICATIONS

None.

BACKGROUND OF THE INVENTION

1. Field of the Invention

The present invention is for a circuit board, and more particularly, is for a circuit board having improved soldering characteristics with respect to components which can be secured to a circuit board such as by soldering.

2. Description of the Prior Art

Prior art circuit boards often utilize wave soldering techniques to flow liquidized solder at a raised temperature along one surface or more of a circuit board to effect multiple solder joints between the soldering pads of the circuit board and the leads of one or more electrical or electronic components such as, but not limited to, a light emitting diode. Maintaining the quality of a suitable solder joint can be problematic in that a cold solder joint may be produced when solder cannot flow fully into the region of intended solder flow. Such a problem can be caused due to limited or non-existent gas flow and breathing within or above the region of intended solder flow, such as caused by the region of intended solder flow being a closed space having a pneumatic-like seal whereby solder flow cannot reach the region of intended solder flow, or if the solder does reach the region of intended solder flow, the heat is dissipated due to slow movement of the solder before sufficient heating of the solder joint takes place. Additionally, air or other gases trapped in the upper region of intended solder flow cannot be displaced by the solder flow, and a back pressure may build to impede the flow of solder therein. Clearly what is needed is a region of improved solder flow between a component lead and a circuit board to improve the quality of a solder joint such as is provided by the instant invention.

SUMMARY OF THE INVENTION

The general purpose of the present invention is to provide a circuit board having improved soldering characteristics.

According to one embodiment of the present invention, there is provided a circuit board having improved soldering characteristics having raised structure consisting of spacer pads arranged to provide for vertical distancing of electrical or electronic components from the component side planar surface of the circuit board to create a vented space between the planar surface of the circuit board and the body of an electronic component as well as a slightly increased size space at the solder station(s). The spacer pads, which can be of different forms, are located in close proximity about the regions where the components are to be located on the component side of the circuit board. One form of a spacer pad can be a stand alone spacer pad and another form can be a spacer pad juxtaposing a solder station, referred to as a terminal spacer pad because of its near location to the solder station or "terminal." Regardless of the form of spacer pad, whether a stand alone spacer pad or a terminal spacer pad, the upper surface of each spacer pad projects a like distance above the planar surface of the circuit board to provide for component spacing from the planar surface of the circuit board. More importantly, such spacer pads raise the lower surface of the component above the levels of the solder stations so that venting is allowed and provided extending upwardly through the circuit board at the upper region of the circuit board at the solder stations. Such venting allows for escaping of gases through the upper regions of the solder stations to negate a vapor lock, thus allowing unimpeded flow of molten solder therein in a timely fashion to effect a proper solder joint.

One significant aspect and feature of the present invention is a circuit board having improved soldering characteristics.

Another significant aspect and feature of the present invention is a circuit board having spacer pads which are stand alone pads or terminal spacer pads juxtaposing solder stations.

Still another significant aspect and feature of the present invention is the use of spacer pads to provide a clear area at the upper region of the solder station for the clear passage release and unrestricted flow of gases upwardly during the soldering process, thus allowing solder flow unimpeded therein to effect a proper solder joint.

Yet another significant aspect and feature of the present invention is the spacing of components above the circuit board to increase cooling airflow around the undersides of the components.

Having thus described embodiments of the present invention, it is the principal object of the present invention to provide a circuit board having improved soldering characteristics.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
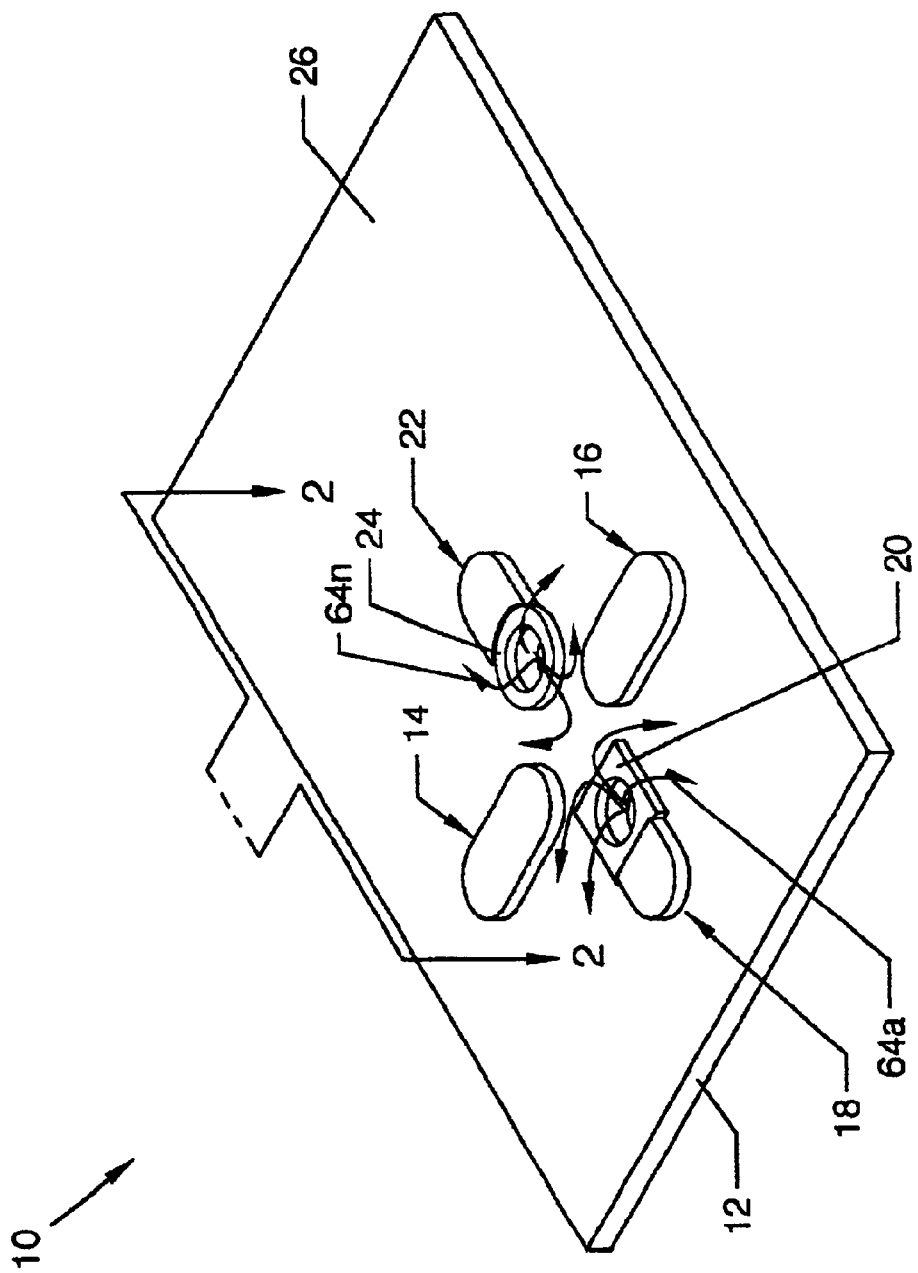
FIG. 1 illustrates an isometric view of a circuit board having improved soldering characteristics, the present invention.

FIG. 1 illustrates an isometric view of a circuit board having improved soldering characteristics 10, the present invention, also referred herein as the circuit board 10. Clearly and readily viewable components or features of the circuit board 10, shown in the illustration, include a substrate 12, opposing stand alone spacer pads 14 and 16, a terminal spacer pad 18 juxtaposing a solder station 20, and a terminal spacer pad 22 juxtaposing a solder station 24. An upper plastic mask 26 is applied to the upper surface of the substrate 12 and also overlies and forms the upper regions of the stand alone spacer pads 14 and 16 and the terminal spacer pads 18 and 22, as later described and shown in detail.

Figure 2:
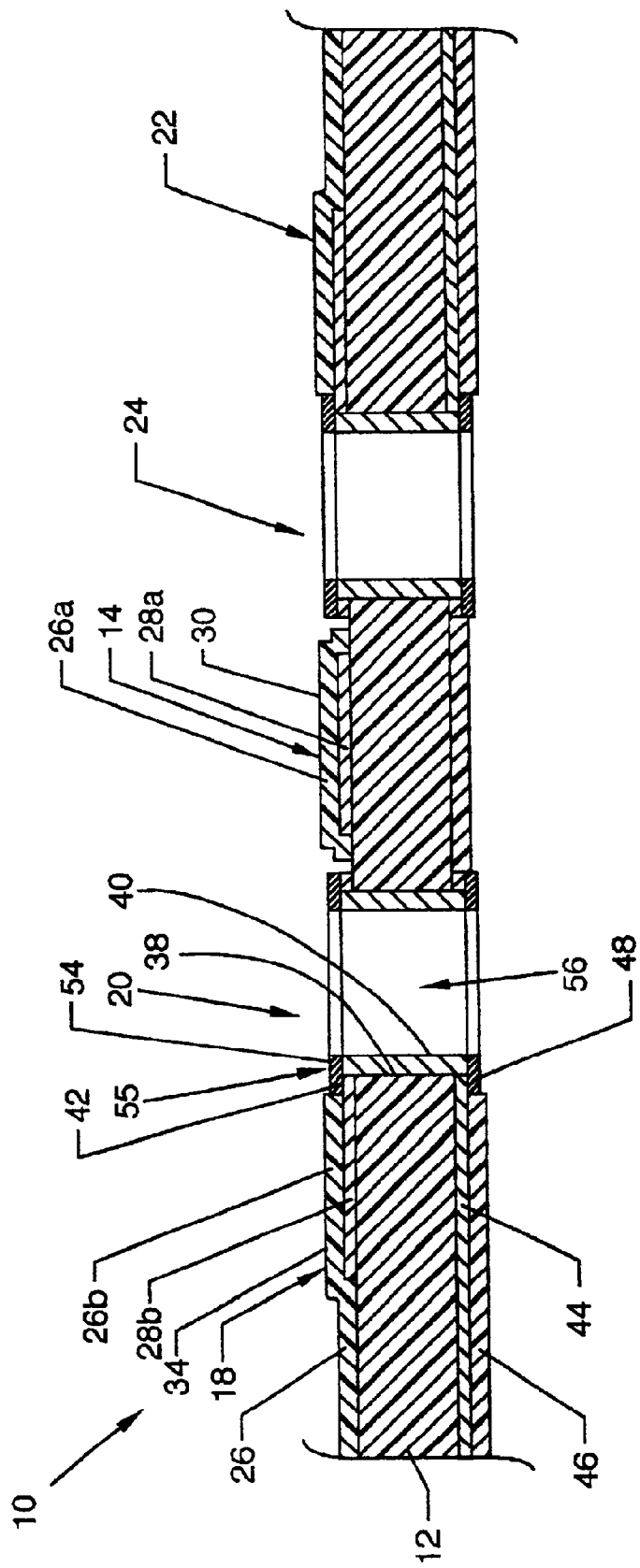
FIG. 2 illustrates a cross section view of the circuit board having improved soldering characteristics along line 2—2 of FIG. 1.

FIG. 2 illustrates a cross section view of the circuit board having improved soldering characteristics 10 along line 2—2 of FIG. 1. Stand alone spacer pad 14 is formed on the upper surface of the substrate 12 by an elongated foil member 28a such as an elongated circle or other suitably shaped form and an overlying raised plastic mask portion 26a of the upper plastic mask 26 having an upper surface 30 being above the upper surface of the general layer upper plastic mask 26, that surface 30 upon which a lower surface of an electrical or electronic component can rest and be spaced. The stand alone spacer pad 16 of FIG. 1, having the same functionality as that of the stand alone spacer pad 14, is formed in the same manner and fashion and is not described for purposes of brevity. The terminal spacer pad 18 is formed in the same manner as described for the stand alone spacer 14 on the upper surface of the substrate 12 by a truncated and suitably shaped elongated foil member 28b and an overlying raised plastic mask portion 26b of the upper plastic mask 26 having an upper surface 34 being above that of the general layer of the upper plastic mask 26, that surface 34 upon which a lower surface of a component can rest and be spaced. The terminal spacer pad 18 juxtaposingly aligns to the upper region of the solder station 20, generally referring to the solder station 20 being the region above, about and below a hole 38 extending vertically through the substrate 12, and including hole 38. The foil member 28b is partially devoid of any plastic mask material 26b in the upper region of the solder station 20 and extends about the upper region of and about the hole 38. The solder station 20 also includes a barrel 40 aligned within hole 38 and includes an upper tinned layer 42 extending between and connecting the upper region of the barrel 40 and the heretofore previously exposed portion of the foil member 28b. The upper surface 54 of the tinned layer 42 is located at a level beneath that of the upper surface 34 of the raised plastic mask portion 26b to partially form a horizontally aligned space 55 adjoining the upper region of a vertically aligned passage 56, as also shown in FIGS. 3 and 4.

A connecting foil member 44 on the lower surface of the substrate 12 leads to the lower region of the solder station 20 and is covered by a lower plastic mask 46. One end of the connecting foil member 44 is devoid of any plastic mask material 46 and extends about the lower region of and about the hole 38 and includes a lower tinned layer 48. The lower tinned layer 48 extends as shown to bridge and connect the foil member 44 to the lower region of the barrel 40. Terminal spacer pad 22 and the solder station 24 are constructed in a manner consistent with that of the terminal spacer pad 18 and solder station 20, respectively, and are not described for purposes of brevity.

Figure 3:
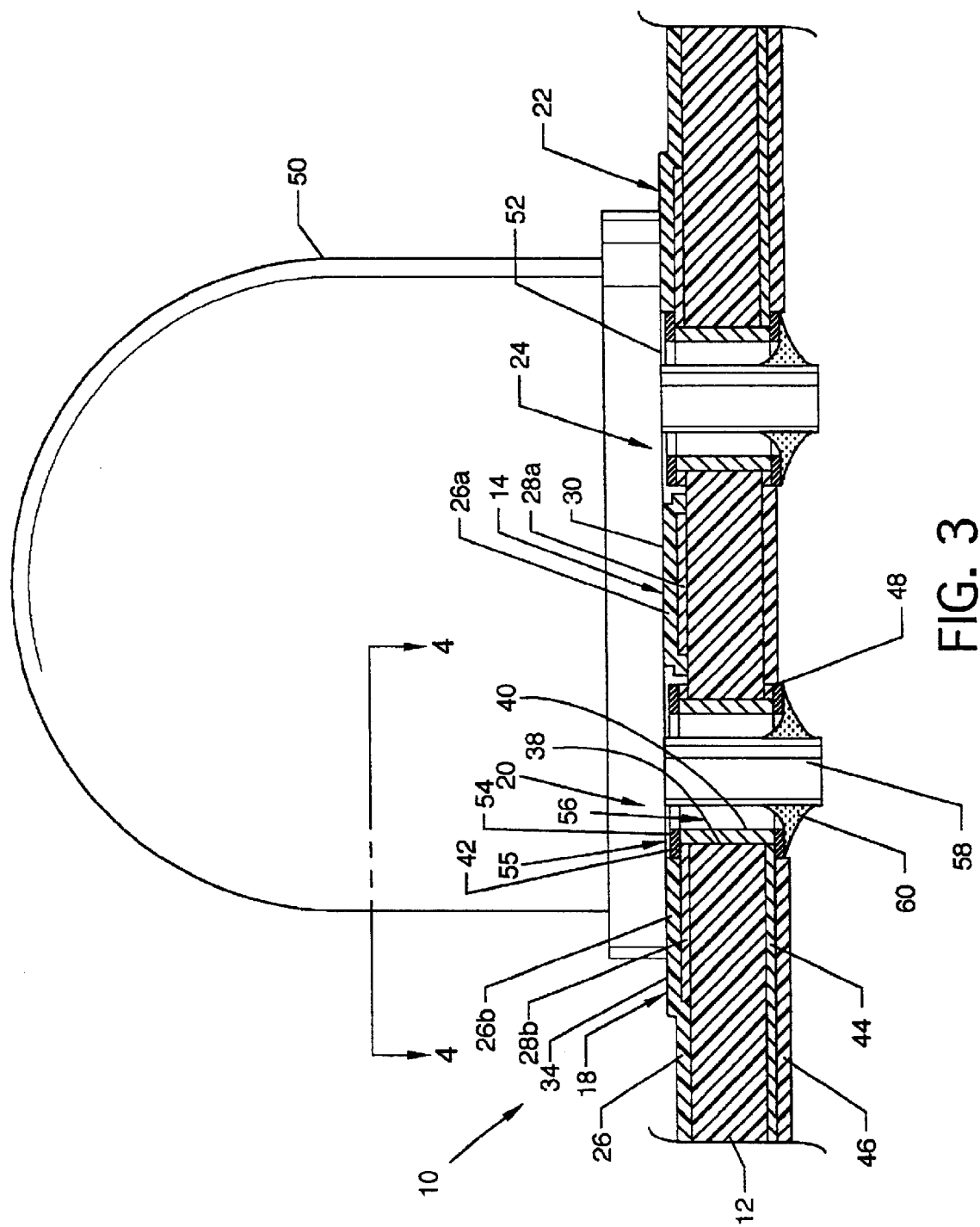
FIG. 3 illustrates a cross section view of a component soldered to the circuit board having improved soldering characteristics.
Figure 4:
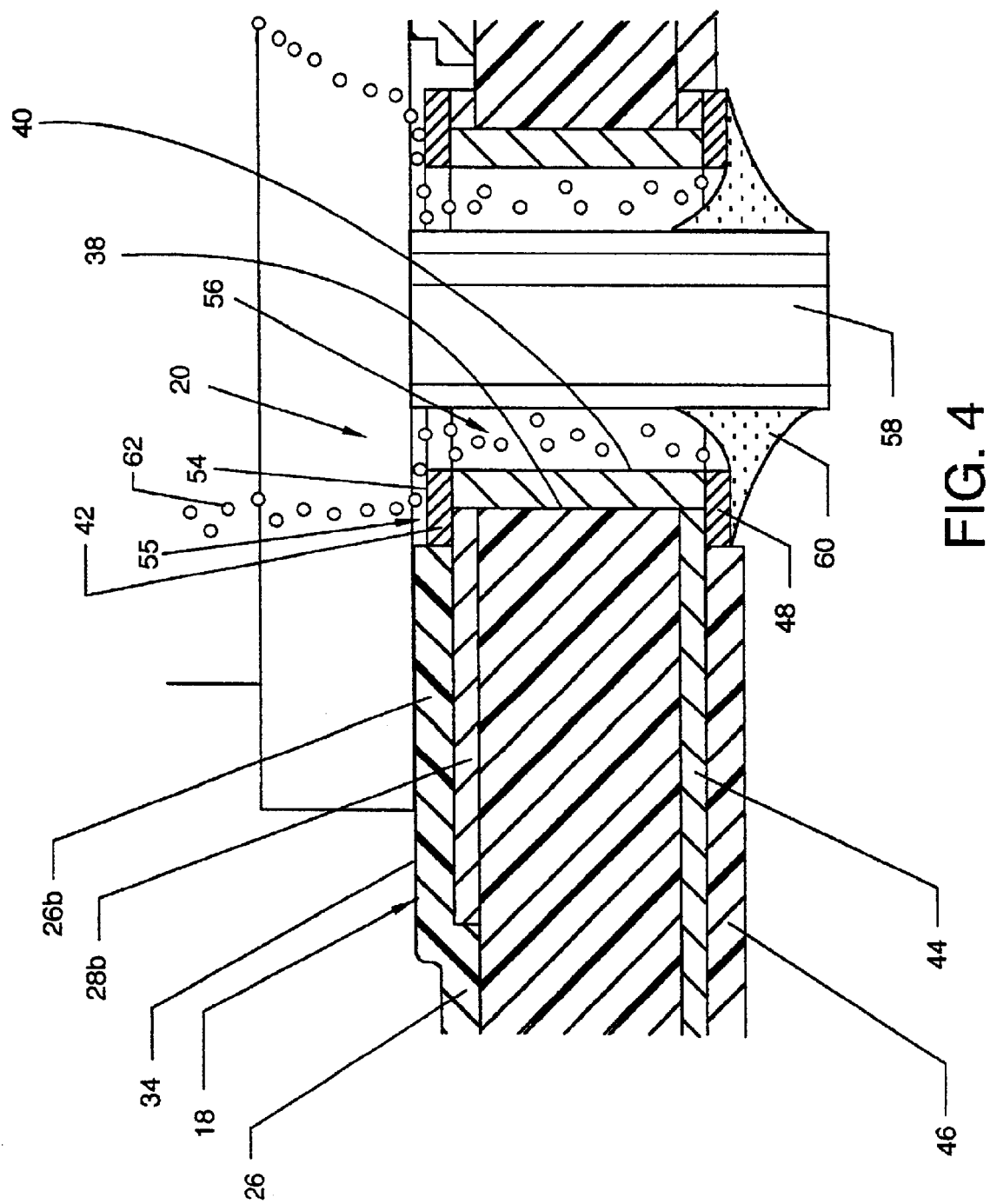
FIG. 4 illustrates a close cross sectional view of FIG. 3 along line 4—4 of FIG. 3; and, FIG. 5, an alternate embodiment, illustrates a cross section view of a circuit board having improved soldering characteristics, having modified solder stations.

FIG. 3 illustrates the cross section view of the circuit board having improved soldering characteristics 10 of FIG. 2, including an electrical or electronic component represented by an LED 50 soldered into the soldering stations 20 and 24. The bottom-surface 52 of the LED 50 is supported by the terminal spacer pads 18 and 22 and by the stand alone spacer pads 14 and 16 (FIG. 1) to space the bottom surface 52 of the LED 50 from the general level of the upper plastic mask 26 and to space the bottom surface 52 of the LED 50 from the upper regions of the solder stations 20 and 24. Space 55, which vents to atmosphere, is located at the upper region of the solder station 20 just above the upper tinned layer 42 and adjoining and in common with the upper portion of the passage 56. The passage 56, which can be annular and which extends upwardly for the release of soldering process gases and which connects with the space 55, is maintained as a passage between the lead 58 of the LED 50 and the barrel 40, as shown. Solder 60 as applied by known wave soldering processes connects the lower tinned layer 48 of the lower foil member 44 to the lead 58 of the LED 50.

MODE OF OPERATION

FIG. 4 illustrates a close cross sectional view of FIG. 3 along line 4—4 of FIG. 3. Solder 60 is applied by wave soldering techniques to flow liquidized solder into solder stations such as solder station 20. Gases 62 given off by the soldering process rise vertically and unimpeded through the passage 56 and then travel horizontally and unimpeded along the space 55 which connects to the passage 56 and thence along the bottom surface 52 of the LED 50 and then outwardly to atmosphere, as shown in the illustration. Such paths of gaseous flow are shown by arrows 64a–64n in FIG. 1 where the gaseous flow rises vertically and then horizontally through and about and along the solder stations 20 and 24 and beneath the spaced electronic component (not shown) and thence to atmosphere.

Figure 5:
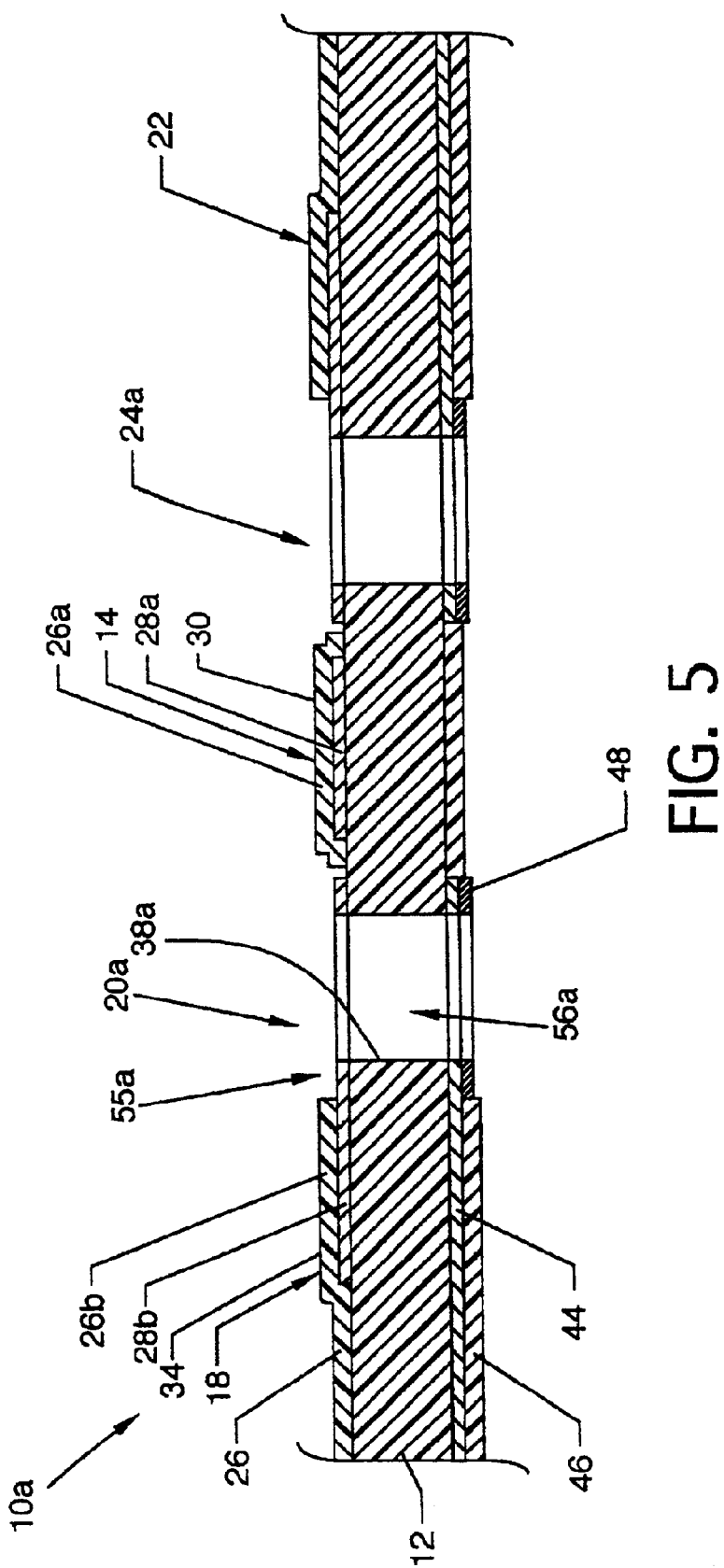

FIG. 5, an alternate embodiment, illustrates a cross section view of a circuit board having improved soldering characteristics 10a, including much of the structure of the previously described embodiment, having modified solder stations 20a and 24a which do not include a barrel 40 or an upper tinned layer 42 connecting the barrel 40 to the foil member 28b. Hole 38 may be resized downwardly and the foil members 28b and 44 extended as required to juxtapose the upper region of a resized hole 38a. A horizontally aligned space 55a surrounding the upper region of the hole 38a aligns and connects to the passage 56a which can be annular and which extends upwardly for the release of soldering process gases, as previously described. The circuit board having improved soldering characteristics 10a functions much the same as the previously described circuit board having improved soldering characteristics 10 but is of fewer components and thus more economical to produce.

Various modifications can be made to the present invention without departing from the apparent scope hereof.

CIRCUIT BOARD HAVING IMPROVED SOLDERING CHARACTERISTICS

PARTS LIST

| | |
|---|---|
| 10 | circuit board having improved soldering characteristics |
| 10a | circuit board having improved soldering characteristics |
| 12 | substrate |
| 14 | stand alone spacer pad |
| 16 | stand alone spacer pad |
| 18 | terminal spacer pad |
| 20 | solder station |
| 20a | solder station |
| 22 | terminal spacer pad |
| 24 | solder station |
| 24a | solder station |
| 26 | upper plastic mask |
| 26a-b | raised plastic mask portions |
| 28a-b | foil members |
| 30 | upper surface |
| 34 | upper surface |
| 38 | hole |
| 38a | hole |
| 40 | barrel |
| 42 | upper tinned layer |
| 44 | foil member |
| 46 | lower plastic mask |
| 48 | lower tinned layer |

-continued

PARTS LIST

| | |
|---|---|
| 50 | LED |
| 52 | bottom surface |
| 54 | upper surface |
| 55 | space |
| 55a | space |
| 56 | passage |
| 56a | passage |
| 58 | lead |
| 60 | solder |
| 62 | gases |
| 64a-n | arrows |

What is claimed is:

1. In combination:

a. a printed circuit board having a top surface and a bottom surface each with an electrically conductive pattern thereon; a plurality of through-holes extending through the printed circuit board from the top surface thereof to the bottom surface thereof, each through-hole having a solder station associated therewith on at least the bottom surface of the printed circuit board, and each through-hole having a plurality of spacer pads oriented around the perimeter thereof on the top surface of the printed circuit board, each spacer pad having a top surface raised above the top surface of the printed circuit board, and the top surfaces of the spacer pads all lying in substantially the same plane; and, b. a component of the type having leads; the component having a lower surface seated upon the top surfaces of the spacer pads, and the leads of the component being received in the through-holes of the printed circuit board, extending through the through-holes of the printed circuit board, and being soldered to the solder stations associated with the through-holes on the bottom surface of the printed circuit board; the spacer pads serving to space the bottom surface of the component a distance above the top surface of the printed circuit board sufficient to allow gasses generated during soldering of the component leads to the solder stations to escape from beneath the component and vent to the atmosphere, and to provide air flow for cooling of the component during operation.

2. The combination as defined in claim 1, wherein the plurality of spacer pads oriented around the perimeter of each through-hole are three in number.

* * * * *